(12) United States Patent
Li et al.

(10) Patent No.: US 8,924,591 B2
(45) Date of Patent: Dec. 30, 2014

(54) METHOD AND DEVICE FOR DATA SEGMENTATION IN DATA COMPRESSION

(75) Inventors: Chunqiang Li, Shenzhen (CN); Zhigang Huang, Nanjing (CN); Feng Li, Nanjing (CN); Yu Zheng, Langfang (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 203 days.

(21) Appl. No.: 13/588,851

(22) Filed: Aug. 17, 2012

(65) Prior Publication Data

US 2012/0311188 A1 Dec. 6, 2012

Related U.S. Application Data

(63) Continuation of application No. PCT/CN2011/073483, filed on Apr. 28, 2011.

(30) Foreign Application Priority Data

Jun. 29, 2010 (CN) .......................... 2010 1 0213950

(51) Int. Cl.
*G06F 15/16* (2006.01)
*H03M 7/30* (2006.01)

(52) U.S. Cl.
CPC .......... *H03M 7/3088* (2013.01); *H03M 7/3086* (2013.01)
USPC ............................. 709/247; 709/203; 709/204

(58) Field of Classification Search
CPC .......... G06F 15/16; H03M 5/00; G06G 12/04
USPC .................................................. 709/247, 203
See application file for complete search history.

(56) References Cited

U.S. PATENT DOCUMENTS 5,701,125 A * 12/1997 Berlin ............................. 341/63
6,667,700 B1  12/2003 McCanne et al.
(Continued)

FOREIGN PATENT DOCUMENTS

| CN | 1972132 A | 5/2007 |
|---|---|---|
| CN | 1997011 A | 7/2007 |
| CN | 101493499 A | 7/2009 |
| WO | WO 2004/042930 A2 | 5/2004 |
| WO | WO 2008/083046 A2 | 7/2008 |

OTHER PUBLICATIONS

Chinese Search Report received in Application No. 201010213950.4, mailed Apr. 7, 2013, 5 pages.

(Continued)

*Primary Examiner* — Waseem Ashraf
*Assistant Examiner* — Zia Khurshid
(74) *Attorney, Agent, or Firm* — Slater & Matsil, L.L.P.

(57) ABSTRACT

A method and device for data segmentation in data compression are disclosed. The method includes: acquiring a segmentation rule corresponding to the length of a current unsegmented data stream according to the length of the current unsegmented data stream in a data stream to be compressed, whereas the length of the unsegmented data stream increases, the probability that the corresponding segmentation rule is satisfied increases monotonically, and when the segmentation rule corresponding to a first length is satisfied, the segmentation rule corresponding to a second length is definitely satisfied too; where the first length and the second length are the length of the unsegmented data stream, and the first length is smaller than the second length; and segmenting, by using the segmentation rule, the data stream to be compressed.

14 Claims, 6 Drawing Sheets

```
┌─────────────────────────────────────────────┐
│ Acquire a segmentation rule corresponding    │
│ to the length of a current unsegmented data  │
│ stream according to the length of the        │
│ current unsegmented data stream in a data    │
│ stream to be compressed, wherein as the      │
│ length of the unsegmented data stream        │
│ increases, the probability that a            │
│ corresponding segmentation rule is satisfied │──11
│ increases monotonically, and when the        │
│ segmentation rule corresponding to a first   │
│ length is satisfied, the segmentation rule   │
│ corresponding to a second length is          │
│ definitely satisfied too; where the first    │
│ length and the second length are the length  │
│ of the unsegmented data stream, and the      │
│ first length is smaller than the second      │
│ length                                       │
└─────────────────────────────────────────────┘
                      │
                      ▼
┌─────────────────────────────────────────────┐
│ Segment, by using the segmentation rule,    │──12
│ the data stream to be compressed            │
└─────────────────────────────────────────────┘
```

(56) References Cited

U.S. PATENT DOCUMENTS

| | | | |
|---|---|---|---|
| 7,720,299 B2* | 5/2010 | Hou | 382/250 |
| 2008/0159331 A1 | 7/2008 | Mace et al. | |
| 2009/0077580 A1* | 3/2009 | Konig et al. | 725/34 |
| 2012/0136842 A1* | 5/2012 | Zhu et al. | 707/692 |

OTHER PUBLICATIONS

Written Opinion of the International Searching Authority received in Application No. PCT/CN2011/073483, Applicant: Huawei Tech. Co. Ltd., et al., mailed Aug. 11, 2011.

Deutsch, P., "Deflate Compressed Data Format Specification version 1.3," Network Working Group, RFC 1951, May 1996, 16 pages.

International Search Report received in Patent Cooperation Treaty Application No. PCT/CN2011/073483, Aug. 11, 2011, 4 pages.

Rabin, Michael O., et al., "Fingerprinting by Random Polynomials," Thesis, The Hebrew University of Jerusalem and Harvard University, 1981, 14 pages.

Salomon, David, "Data Compression: The Complete Reference, 3 Dictionary Methods," Data Compression: The Complete Reference, Springer, New York, ISBN: 978-0-387-98280-9, Jan. 1, 1998, 66 pages.

Extended European Search Report received on Application No. 11780151.4, mailed May 16, 2013, 5 pages.

\* cited by examiner

METHOD AND DEVICE FOR DATA SEGMENTATION IN DATA COMPRESSION

This application is a continuation of co-pending International Application No. PCT/CN2011/073483, filed Apr. 28, 2011, which designated the United States and was not published in English, and which claims priority to Chinese Application No. 201010213950.4, filed Jun. 29, 2010, both of which applications are incorporated herein by reference.

TECHNICAL FIELD

The present invention relates to communications technologies, and in particular, to a method and device for data segmentation in data compression.

BACKGROUND

Data compression is a technology widely applied in data storage and transmission. With respect to transmitted data, due to large amounts of redundant data, a network device at a transmitting end transmits data after compressing the data, which may effectively reduce data volume in the case of data transmission over a network and reduces transmission delay. Correspondingly, a network device at a receiving end needs to decompress received data.

At present, compression technologies used for data transmission may be categorized into two types. One is a compression technology based on LZ (Lempel-Ziv) algorithms, and the other is referred to as a data deduplication technology. With respect to the LZ compression technology, the transmitting end generally performs matching inside a data block by using a sliding window, so as to generate a compressed dictionary and performs compression, and the receiving end generates a corresponding dictionary and performs decompression. With respect to the data deduplication technology, large blocks of repeated data exist during data transmission, and the network device stores a large data block transmitted through the device and uses it as a dictionary entry. During subsequent data transmission, each time a repeated data block is detected, a short code index in the dictionary is used to replace the repeated data block. The receiving end restores the original data according to a received code index and stored dictionary entry.

If the data transmitted over the network is taken as a bit stream, the network device needs to properly segment a data stream that is transmitted through the device, and takes data segments as dictionary entries for data compression. The length of a data segment affects the utilization efficiency of the dictionary and a compression ratio. A too large length reduces the utilization efficiency of the dictionary and a too small length reduces the compression ratio.

If a segmentation method with a fixed number of bytes is used, when the data of a data segment changes, the boundaries of its following data segments all change so that the dictionary entries created according to the subsequent data segments cannot be effectively used. To solve such problem caused by fixed size segmentation, the prior art may use a content fingerprint (Fingerprint), and use a sliding window with the size of W to slide in the data stream to be processed. The sliding may be performed in a one-by-one byte manner or in a two-by-two bytes manner. During each sliding process, the content fingerprint of a data block in the window is calculated. When the content fingerprint satisfies a preset rule, the boundary along the sliding direction of the window is taken as a segmentation point; otherwise, sliding of the window is continued to calculate the content fingerprint until a segmentation point is determined.

During implementation of the present invention, the inventor finds at least the following problems in the prior art. With the above segmentation method, the length of the data segmentation may be too large, which may cause a reduction of the matching probability and reduce the utilization efficiency of the dictionary.

SUMMARY OF THE INVENTION

Embodiments of the present invention provide a method and device for data segmentation in data compression to solve the problem that the length of the data segmentation is too large in the prior art.

An embodiment of present invention provides a method for data segmentation in data compression. The method includes acquiring a segmentation rule corresponding to the length of a current unsegmented data stream according to the length of the current unsegmented data stream in a data stream to be compressed. As the length of the unsegmented data stream increases, the probability that the corresponding segmentation rule is satisfied increases monotonically. When the segmentation rule corresponding to a first length is satisfied, the segmentation rule corresponding to a second length is definitely satisfied too. The first length and the second length are the length of the unsegmented data stream, and the first length is smaller than the second length. The data stream to be compressed is segmented using the segmentation rule.

An embodiment of present invention provides a device for data segmentation in data compression. An acquiring module is configured to acquire a segmentation rule corresponding to the length of a current unsegmented data stream according to the length of the current unsegmented data stream in a data stream to be compressed. As the length of the unsegmented data stream increases, the probability that the corresponding segmentation rule is satisfied increases monotonically. When the segmentation rule corresponding to a first length is satisfied, the segmentation rule corresponding to a second length is definitely satisfied too. The first length and the second length are the length of the unsegmented data stream, and the first length is smaller than the second length. A segmenting module is configured to segment the data stream to be compressed using the segmentation rule.

It can be seen from the above technical solution that according to the embodiments of the present invention, the length of segmentation rule corresponding to an unsegmented data stream is obtained; and when the segmentation rule satisfies the condition, the larger the length of the data stream, the higher the probability of the segmentation rule that is satisfied. Therefore, the segmentation is performed more conveniently, therefore the length of the data segment may be effectively controlled, and the matching probability and utilization efficiency of the dictionary are improved.

BRIEF DESCRIPTION OF THE DRAWINGS

To make the technical solution provided in embodiments of the present invention or the prior art clearer, the accompanying drawings for illustrating the embodiments of the present invention or the prior art are briefly described below. Obviously, such drawings are for exemplary purpose, and a person skilled in the art may derive other drawings from such accompanying drawings without creative efforts.

DETAILED DESCRIPTION OF ILLUSTRATIVE EMBODIMENTS

The following describes the implementation of the present invention in combination with embodiments. Obviously, the embodiments are merely exemplary ones for illustrating the present invention. A person skilled in the art may derive other embodiments from the embodiments given here without making creative efforts, and all such embodiments are covered in the protection scope of the present invention.

Figure 1:
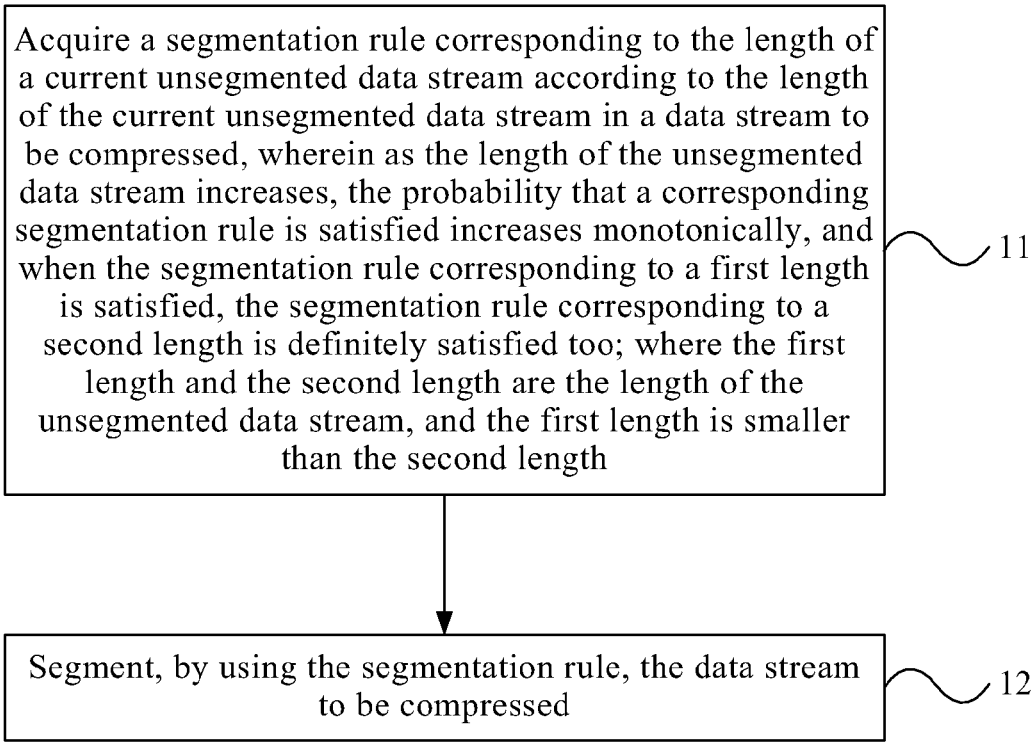
FIG. 1 is a schematic flowchart of a method according to an embodiment of the present invention.

FIG. 1 is a schematic flowchart of a method according to a first embodiment of the present invention. The method includes the following steps.

Step 11: Acquire a segmentation rule corresponding to the length of a current unsegmented data stream according to the length of the current unsegmented data stream in a data stream to be compressed, whereas the length of the unsegmented data stream increases, the probability that a corresponding segmentation rule is satisfied increases monotonically, and when the segmentation rule corresponding to a first length is satisfied, the segmentation rule corresponding to a second length is definitely satisfied too; where the first length and the second length are the length of the unsegmented data stream, and the first length is smaller than the second length.

After the data stream to be compressed is received, the data stream is cached. Before segmentation, the length of the cached data stream is recorded. Therefore, the length of the unsegmented data stream may be obtained.

A mapping relationship between lengths of an unsegmented data stream and segmentation rules may be preset. The corresponding segmentation rule is obtained according to the mapping relationship.

Alternatively, an equation may also be set as the segmentation rule.

For the implementation of the above two methods for setting the segmentation rule, reference may be made to the second and third embodiments below.

Step 12: Segment, by using the segmentation rule, the data stream to be compressed.

According to the embodiments of the present invention, a segmentation point is determined by matching a content fingerprint and the segmentation rule. Specifically, the content fingerprint is for the data content in a current sliding window. When the content fingerprint satisfies a corresponding segmentation rule, a first endpoint of the current sliding window is taken as the segmentation point, where the first endpoint is an endpoint of the current sliding window in the same direction as the sliding direction of the current sliding window. For example, when the sliding window slides from a data end with a small sequence number to a data end with a large sequence number, the first endpoint is an endpoint corresponding to the data with a larger sequence number.

According to this embodiment, the segmentation rule corresponding to the length of the unsegmented data stream is obtained. The probability that the segmentation rules is satisfied monotonically increases as the length of the unsegmented data stream increases, and therefore it is more possible that the data stream is segmented. In addition, when the segmentation rule corresponding to a smaller length is satisfied, the segmentation rule corresponding to a larger length is definitely satisfied. Compared with a segmentation rule which is fixed and unrelated to the length of the unsegmented data stream, the segmentation rule according to this embodiment ensures that the segmentation point obtained by using the segmentation rule which is fixed remains an available segmentation point. The length of the data segment may be effectively controlled by increasing the probability of the segmentation and ensuring that an original segmentation point remains an available segmentation point, which improves a matching probability and the utilization efficiency of a dictionary.

Figure 2:
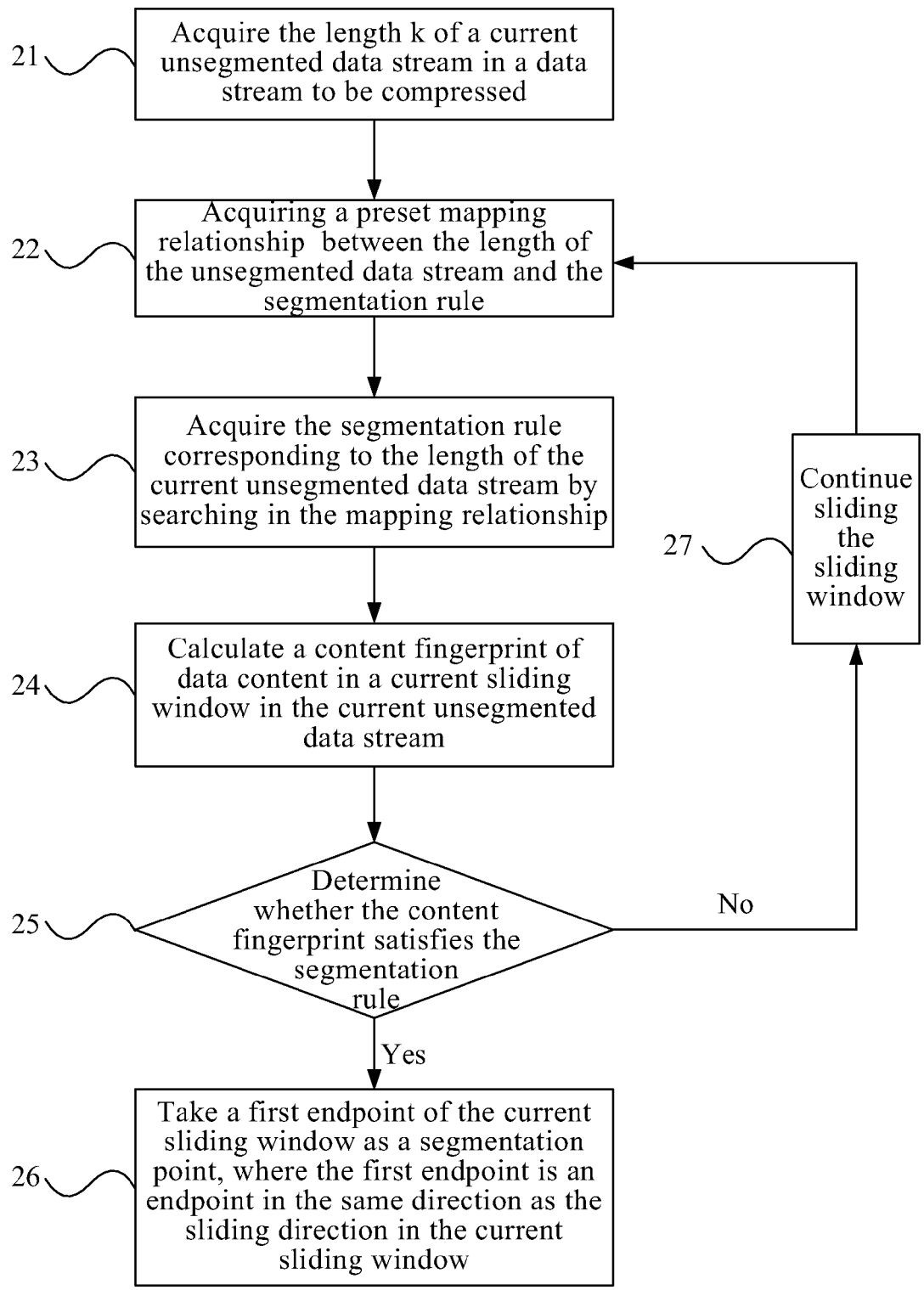
FIG. 2 is a schematic flowchart of a method according to a second embodiment of the present invention.

FIG. 2 is a schematic flowchart of a method according to a second embodiment of the present invention. This embodiment uses presetting a mapping relationship as an example. Referring to FIG. 2, the method includes the following steps.

Step 21: Acquire the length k of a current unsegmented data stream in a data stream to be compressed.

Step 22: Acquire a preset mapping relationship between lengths of an unsegmented data stream and segmentation rules.

Table 1 shows the mapping relationship.

TABLE 1

| | Length (Byte) of Unsegmented Data Stream | | | | |
|---|---|---|---|---|---|
| | [0, 512] | (512, 1024] | (1024, 1536] | (1536, 2048] | Others |
| Segmentation rule | Least significant 7 bits of RF (SK) = 0 | Least significant 6 bits of RF (SK) = 0 | Least significant 4 bits of RF (SK) = 0 | Least significant 3 bits of RF (SK) = 0 | Least significant 1 bit of RF (SK) = 0 |

SK is the data content in the current sliding window, and RF (SK) is the content fingerprint of the data content in the current siding window. For example, the content fingerprint may be a hash (Hash) function of the data content, e.g., may be obtained by using a Rabin Fingerprint function, cyclic redundancy check (Cyclic Redundancy Check, CRC) algorithm, or MD5 (Message Digest 5) algorithm.

In Table 1, if k is 512, the segmentation rule is that the least significant 7 bits of RF (SK)=0; if RF (SK) satisfies the segmentation rule, i.e., the least significant 7 bits of RF (SK) are all 0s, the least significant 6 bits, the least significant 4 bits, the least significant 3 bits, and the least significant 1 bit are all 0s. Therefore, RF (SK) also satisfies the segmentation rule corresponding to k when k is a number greater than 512 such as 513, 514 and so on. In addition, with the increase of k, the probability that the segmentation rule is satisfied increases, for example, monotonic increases, as shown in Table 1. It may be understood that the mapping relationship shown in Table 1 is for exemplary purpose, which is not limited to Table 1. For example, the values of the above least significant N bits are changed from all 0s to all 1s. However, it should be noted that if the content fingerprint of the data content in the current sliding window satisfies the segmentation rule corresponding to a smaller k, the content fingerprint definitely satisfies the segmentation rule corresponding to a larger k.

Step 23: Acquire the segmentation rule corresponding to the length of the current unsegmented data stream by searching in the mapping relationship.

For example, when k falls within [0,512], the segmentation rule is that the least significant 7 bits of RF (SK) are all 0s; when k falls within (512,1024], the segmentation rule is that the least significant 6 bits of RF (SK) are all 0s, and so on.

Step 24: Calculate a content fingerprint RF (SK) of data content in a current sliding window in the current unsegmented data stream.

Step 25: Determine whether the content fingerprint satisfies the segmentation rule; if it satisfies the segmentation rule, perform step 26; otherwise, perform step 27.

Specifically, after RF (SK) is calculated, it may be compared with the segmentation rule obtained in step 23 so as to determine whether RF (SK) satisfies the segmentation rule.

Step 26: Take a first endpoint of the current sliding window as a segmentation point, where the first endpoint is an endpoint of the current sliding window in the same direction as the sliding direction of the current sliding window.

For example, when a data end with a small sequence number slides towards a data end with a large sequence number, the data end with a large sequence number in the current sliding window is taken as the segmentation point.

Step 27: Continue sliding the sliding window.

For example, the sliding window is slid to the right by one byte or double bytes.

Subsequently, the process may be performed again from step 21 until a segmentation point is found.

According to this embodiment, a mapping relationship is preset. In the mapping relationship, when the content fingerprint satisfies the segmentation rule corresponding to a smaller k, it definitely satisfies the segmentation rule corresponding to a larger k. In this way, the original segmentation point of the data stream remains an available segmentation point after the data stream is added with new data. In addition, with the increase of k, the probability that the segmentation rule is satisfied increases. Therefore, the probability of being segmented when k is larger is increased, which prevents larger data segments and improves the utilization efficiency of the dictionary.

Figure 3:
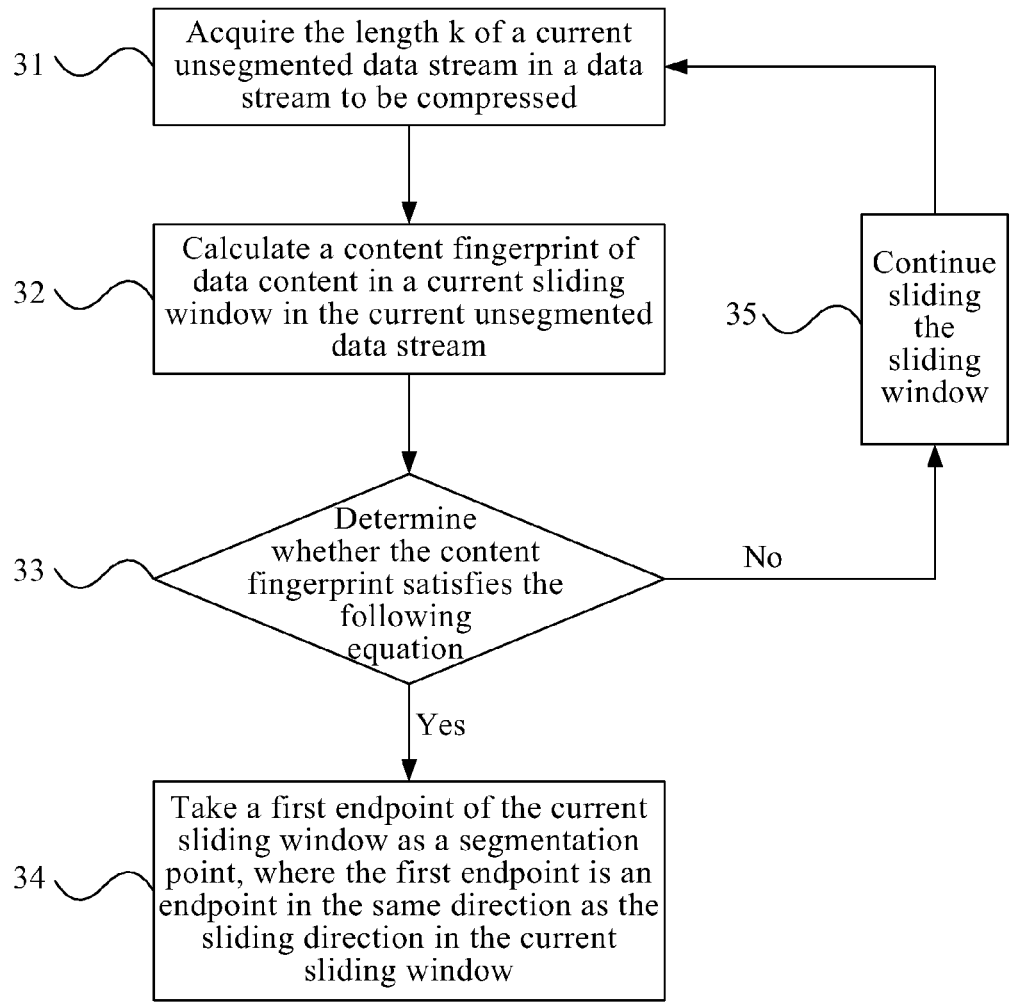
FIG. 3 is a schematic flowchart of a method according to a third embodiment of the present invention.

FIG. 3 is a schematic flowchart of a method according to a third embodiment of the present invention. In this embodiment, a case where the segmentation rule is an equation related to k is taken as an example. Referring to FIG. 3, this embodiment includes steps 31-35.

Step 31: Acquire the length k of a current unsegmented data stream in a data stream to be compressed.

Step 32: Calculate a content fingerprint RF (SK) of data content in a current sliding window in the current unsegmented data stream. RF ( ) is the content fingerprint. The content fingerprint may be a Hash (Hash) function of the data content, or may be obtained by using the Rabin Fingerprint function, cyclic redundancy check (Cyclic Redundancy Check, CRC) algorithm, or MD5 (Message Digest 5) algorithm.

Step 33: Determine whether the content fingerprint satisfies the following equation; if it satisfies the equation, perform step 34; otherwise, perform step 35.

The equation is as follows:

$$RF(SK) MOD 2^{[(\frac{M}{k})]} = c MOD 2^{[(\frac{M}{k})]}$$

where SK is the data content in the current sliding window, RF (SK) is the content fingerprint of the data content in the current sliding window, c is a preset constant, M is a preset maximum segmentation length, k is the length of the unsegmented data stream, MOD (*) indicates a modulo operation, and [*] indicates a floor function. The equation is not the only option, but the equation needs to have the following character: when RF (SK), which satisfies the equation in the case of a smaller k, definitely satisfies the equation in the case of a larger k.

Step 34: Take a first endpoint of the current sliding window as a segmentation point, where the first endpoint is an endpoint of the current sliding window in the same direction as the sliding direction of the current sliding window.

For example, when a data end with a small sequence number slides towards a data end with a large sequence number, the data end with a large sequence number in the current sliding window is taken as the segmentation point.

Step 35: Continue sliding the sliding window.

For example, the sliding window is slid by one byte or double bytes.

Subsequently, the process may be performed again from step 31 until a segmentation point is found.

According to this embodiment, an equation is preset. In the equation, the lager k is, the higher the probability that equation is satisfied. When the content fingerprint satisfies the equation in the case of a smaller k, it definitely satisfies the equation in the case of a larger k. In this way, the original segmentation point of the data stream remains an available segmentation point after the data stream is added with new data. In addition, the probability of being segmented when k is larger is increased, which prevents larger data segments and improves the utilization efficiency of the dictionary.

The following analyzes the effective control of the length of the data segment and improvement of the utilization efficiency of the dictionary.

When k1 is smaller than k2 and the segmentation rule corresponding to k1 is satisfied, the segmentation rule corresponding to k2 is definitely satisfied, and in addition, the probability that the segmentation rule is satisfied increases with the increase of k. Because the probability that the segmentation rule is satisfied increases with the increase of k, the larger k is, it is more possible that the data is segmented, which effectively controls the length of the data segment. Because when the segmentation rule corresponding to k1 is satisfied, the segmentation rule corresponding to k2 is definitely satisfied, the data block having the same content may have the same segmentation point. In this way, the original segmentation point of the data remains an available segmentation point after the data is added with new data, and the utilization efficiency of the dictionary is improved.

Figure 4:
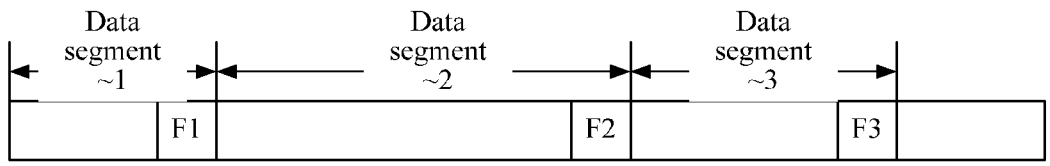
FIG. 4 is a schematic diagram of data segmentation in a first data stream according to an embodiment of the present invention.
Figure 5:
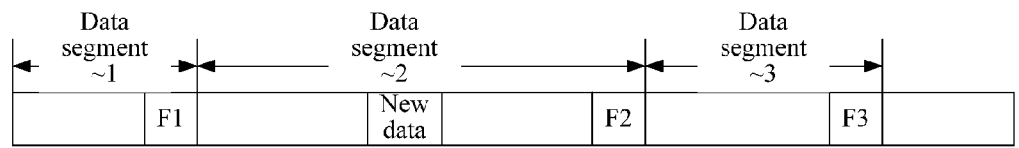
FIG. 5 is a schematic diagram of data segmentation after the first data stream is added with data according to an embodiment of the present invention.
Figure 6A:
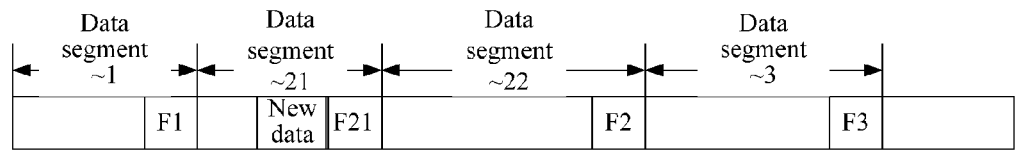
FIG. 6a is a schematic diagram of another data segmentation after the first data stream is added with data according to an embodiment of the present invention.
Figure 6B:
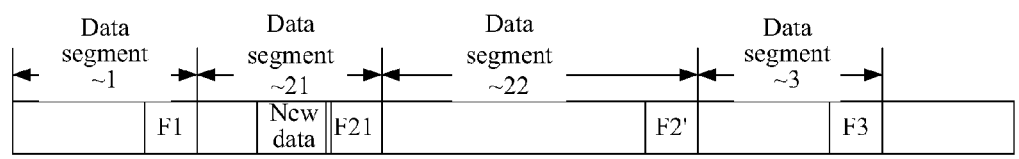
FIG. 6b is a schematic diagram of still another data segmentation after the first data stream is added with data according to an embodiment of the present invention.

For example, FIG. 4 is a schematic diagram of data segmentation in a first data stream according to an embodiment of the present invention. FIG. 5 is a schematic diagram of data segmentation after the first data stream is added with data according to an embodiment of the present invention. FIG. 6a is a schematic diagram of another data segmentation after the first data stream is added with data according to an embodiment of the present invention. FIG. 6b is a schematic diagram of still another data segmentation after the first data stream is added with data according to an embodiment of the present invention. F1, F2, and F3 indicate sliding windows. F1 and F3 satisfies the condition that the least 7 significant bits of the content fingerprint are all 0s; F2 satisfies the condition that the least 4 significant bits of the content fingerprint are all 0s but does not satisfy the condition that the least 7 significant bits of the content fingerprint are all 0s. Obviously, compared with the segmentation rule which is fixed and unrelated to the length of the unsegmented data stream, i.e., the segmentation may be performed only when the least significant 7 bits of the content fingerprint are all 0s regardless of the length of the unsegmented data stream, the technical solution provided in the present invention ensures that the segmentation point obtained by using the segmentation rule which is fixed remains an available segmentation point, and the number of segments may be increased.

The following cases may occur when new data is added to the first data stream.

Case 1: According to the embodiments of the present invention, when the segmentation rule corresponding to a smaller k is satisfied, the segmentation rule corresponding to a larger k is definitely satisfied. Therefore, the data having the same content may have the same segmentation point. To be specific, the segmentation point of the first data stream is also the segmentation point of the second data stream. For example, referring to FIG. 5, after new data is added to a data segment ~2, the segmentation point of the data segment ~2 does not change (the right endpoint of the sliding window F2). Compared with the segmentation method of using the segmentation rule which is fixed, in this segmentation method, a data segment ~3 may be reused, which improves the utilization efficiency of the dictionary.

Case 2: According to the embodiments of the present invention, because of newly inserted data, during calculation of a fingerprint of a window, the window including the inserted data may satisfy a matching rule, and therefore a new segmentation point is generated. For example, referring to FIG. 6a, after new data is added to the data segment ~2, a new segmentation point may be generated inside the data segment ~2 (the right endpoint of the sliding window F21). The length of the unsegmented data stream between the new segmentation point and F2 is smaller than that of the data stream between the right endpoint of F1 and F2. If the length of the unsegmented data stream between the new segmentation point and F2 and the length of the unsegmented data stream between the right endpoint of F1 and F2 fall within a length range corresponding to the same segmentation rule, i.e., the least significant 4 bits of the content fingerprint being all 0s, the segmentation point of F2 is the same as an original one. If the length range does not belong to the same segmentation rule, and the content fingerprint of F2 cannot satisfy the segmentation rule corresponding to the length of a small unsegmented data stream, the segmentation point may change. Referring to FIG. 6b, the segmentation point may change from F2 to F2', or may be determined until F3. The content fingerprint of F2 does not satisfy the segmentation rule which is fixed, i.e., the least significant 7 bits of the content fingerprint being all 0s. Therefore, in this case, no segment is generated even the segmentation rule which is fixed is used. Therefore, compared with the segmentation method of using the segmentation rule which is fixed, in this method, at least the utilization efficiency of the dictionary is not reduced. However, if the content fingerprint of F2 may satisfy the segmentation rule corresponding to the length of the small unsegmented data stream (shown in FIG. 6a), compared with the segmentation method of using the segmentation rule which is fixed, a data segment ~3 may remain available, which improves the utilization efficiency of the dictionary.

It can be seen from the above that when the segmentation rule is satisfied in the case of a smaller k, the segmentation rule in the case of a larger k is definitely satisfied; and in addition, with the increase of k, the probability that the segmentation rule is satisfied increases. In this way, the original segmentation point remains an available segmentation point and a new segmentation point may be generated in an original segment. Therefore, the length of the unsegmented data may be effectively controlled.

Because the length of the data segment is reduced, the utilization efficiency of the dictionary increases accordingly.

Figure 7:
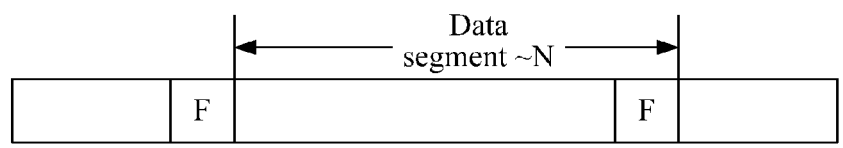
FIG. 7 is a schematic diagram of data segmentation of first data according to an embodiment of the present invention.
Figure 8:
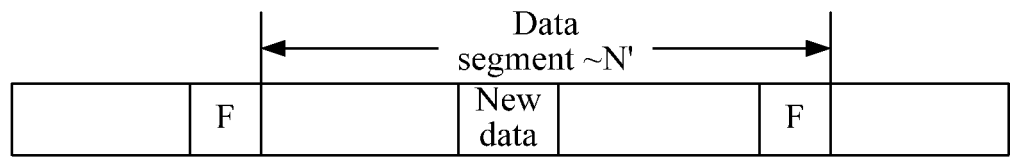
FIG. 8 is a schematic diagram of data segmentation of the first data with added data according to an embodiment of the present invention.
Figure 9:
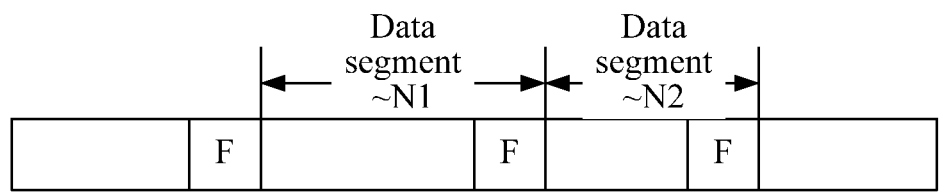
FIG. 9 is a schematic diagram of another segmentation of the first data according to an embodiment of the present invention.
Figure 10:
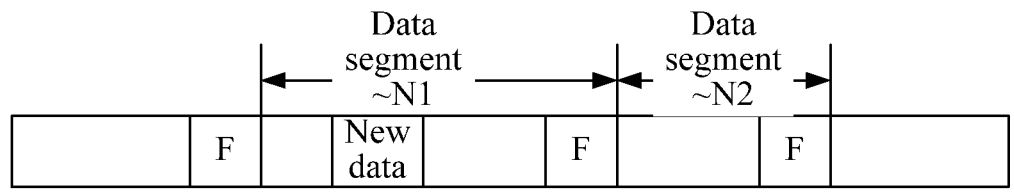
FIG. 10 is a schematic diagram of the another segmentation of the first data with added data according to an embodiment of the present invention.

For example, FIG. 7 is a schematic diagram of segmentation of first data according to an embodiment of the present invention. FIG. 8 is a schematic diagram of segmentation of the first data with added data according to an embodiment of the present invention. FIG. 9 is a schematic diagram of another segmentation of the first data according to an embodiment of the present invention. FIG. 10 is a schematic diagram of the other segmentation of the first data with added data according to an embodiment of the present invention.

Referring to FIG. 7, assume that the first data segment is a large data segment ~N; referring to FIG. 8, a data segment ~N' is obtained after the data segment ~N is added with new data. After being added with the data, the data segment changes, and therefore the data segment ~N cannot be reused. Referring to FIG. 9, with the method according to the embodiments of the present invention, the length of the data segment may be effectively controlled. Therefore, with the method according to the embodiments of the present invention, a larger data segment is segmented into small data segments. Assume that the data segment ~N is segmented into a data segment ~N1 and a data segment ~N2, if data is added to the data segment ~N1, referring to FIG. 10, the data after data adding is the data segment ~N1' and the data segment ~N2 respectively. In this case, only the data segment ~N1 cannot be reused, but the data segment ~N2 may remain available. Therefore, reducing the length of the data segment may improve the utilization efficiency of the dictionary. In another aspect, if a segmentation rule that has a high probability of being satisfied and is unrelated to the length of the unsegmented data stream is directly used, the utilization efficiency of the dictionary may be improved, however, an actual effect is inferior to the technical solution provided in the embodiments of the present invention that may effectively control the length of the data segment because a smaller length of the data segment may reduce the compression efficiency.

Figure 11:
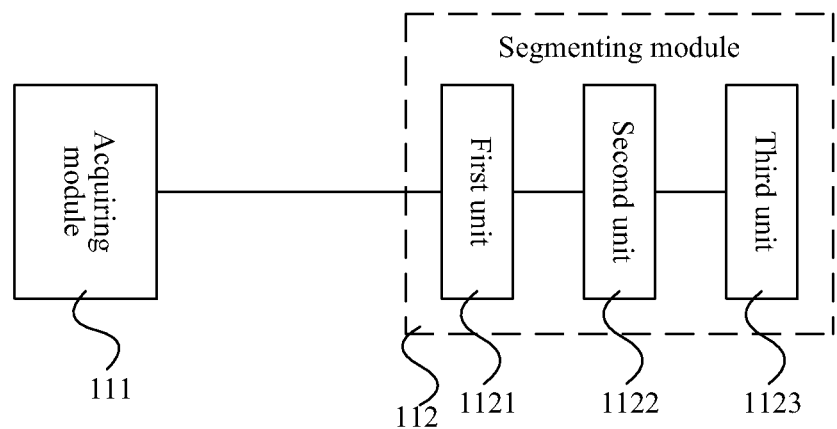
FIG. 11 is a schematic structural diagram of a device according to a fourth embodiment of the present invention.

FIG. 11 is a schematic structural diagram of a network device according to a fourth embodiment of the present invention. The network device includes an acquiring module 111 and a segmenting module 112. The acquiring module 111 is configured to acquire a segmentation rule corresponding to the length of a current unsegmented data stream according to the length of the current unsegmented data stream in a data stream to be compressed, whereas the length of the unsegmented data stream increases, the probability that the corresponding segmentation rule is satisfied increases monotonically, and when the segmentation rule corresponding to a first length is satisfied, the segmentation rule corresponding to a second length is definitely satisfied too; where the first length and the second length are the length of the unsegmented data stream. The segmenting module 112 is configured to segment, by using the segmentation rule, the data stream to be compressed.

The segmentation rule may be the following equation:

$$RF(SK) MOD 2^{[(\frac{M}{k})]} = c MOD 2^{[(\frac{M}{k})]};$$

where SK is the data content in the current sliding window, RF (SK) is the content fingerprint of the data content in the current sliding window, c is a preset constant, M is the preset maximum segmentation length, k is the length of the unsegmented data stream, MOD indicates the modulo operation, and [*] indicates the floor function.

Further, in this case, the segmentation module 112 may include a first unit 1121, a second unit 1122, and a third unit 1123. The first unit 1121 is configured to calculate a content fingerprint of data content in a current sliding window in the current unsegmented data stream. The second unit 1122 is configured to determine whether the content fingerprint satisfies the corresponding segmentation rule. The third unit 1123 is configured to take a first endpoint of the current sliding window as a segmentation point when the content fingerprint satisfies the corresponding segmentation rule, where the first endpoint is an endpoint of the current sliding window in the same direction as the sliding direction of the current sliding window.

Further, the second unit may be specifically configured to, when the corresponding segmentation rule is whether the least significant N bits of the content fingerprint is 1, determine whether the least significant N bits of RF (SK) is all 1s; or the second unit may be specifically configured to, when the corresponding segmentation rule is whether the least significant N bits of the content fingerprint is 0, determine whether the least significant N bits of RF (SK) is all 0s. SK is the data content in the current sliding window, RF (SK) is the content fingerprint of the data content in the current sliding window, and N decreases monotonically as the length of the current unsegmented data stream increases.

According to this embodiment, a mapping relationship is preset. In the mapping relationship, when the content fingerprint satisfies the segmentation rule corresponding to a smaller k, it definitely satisfies the segmentation rule corresponding to a larger k. In this way, the original segmentation point of the data stream remains an available segmentation point after the data stream is added with new data. In addition, with the increase of k, the probability that the segmentation rule corresponding to k is satisfied increases. Therefore, the probability of segmentation when k is larger is increased, which prevents larger data segments and improves the utilization efficiency of the dictionary.

Figure 12:
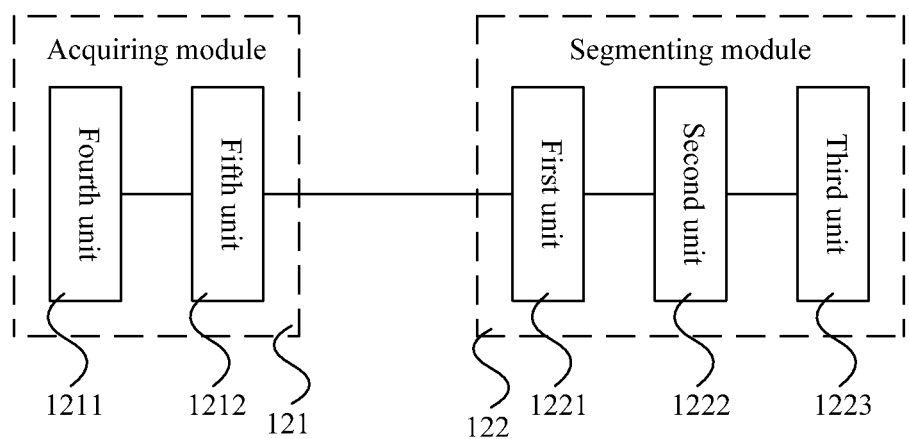
FIG. 12 is a schematic structural diagram of a device according to a fifth embodiment of the present invention.

FIG. 12 is a schematic structural diagram of a device according to a fifth embodiment of the present invention. The device includes an acquiring module 121 and a segmenting module 122. The acquiring module 121 includes a fourth unit 1211 and a fifth unit 1212. The fourth unit 1211 is configured to acquire a preset mapping relationship between lengths of an unsegmented data stream and segmentation rules; and the fifth unit is configured to acquire the segmentation rule corresponding to the length of the current unsegmented data stream by searching in the mapping. The segmenting module 122 includes a first unit 1221, a second unit 1222, and a third unit 1223. The first unit 1221 is configured to calculate a content fingerprint of data content in a current sliding window in the current unsegmented data stream; the second unit 1222 is configured to determine whether the content fingerprint satisfies the corresponding segmentation rule; and the third unit 1223 is configured take a first endpoint of the current sliding window as a segmentation point when the content fingerprint satisfies the corresponding segmentation rule, where the first endpoint of the current sliding window is an endpoint in the same direction as the sliding direction of the current sliding window.

Further, the second unit may be specifically configured to, when the corresponding segmentation rule is whether the least significant N bits of the content fingerprint is 1, determine whether the least significant N bits of RF (SK) is all 1s; or the second unit may be specifically configured to, when the corresponding segmentation rule is whether the least significant N bits of the content fingerprint is 0, determine whether the least significant N bits of RF (SK) is all 0s. SK is the data content in the current sliding window, RF (SK) is the content fingerprint of the data content in the current sliding window, and N decreases monotonically as the length of the current unsegmented data stream increases.

According to this embodiment, an equation is preset. In the equation, the lager k is, the higher the probability that equation is satisfied. When the content fingerprint satisfies the equation in the case of a smaller k, it definitely satisfies the equation in the case of a larger k. In this way, the original segmentation point of the data stream remains an available segmentation point after the data stream is added with new data. In addition, the probability of being segmented is increased when k is larger, which prevents larger data segments and improves the utilization efficiency of the dictionary.

According to the above description of the embodiments, those skilled in the art may easily understand that the embodiments of the present invention may be implemented by using software in combination with a necessary hardware platform, and may also be implemented by only using the hardware. However, in most cases, implementation by using software in combination with necessary hardware is better. Based on the above description, all or parts of the contributions of the technical solution of the present invention to the prior art may be implemented by software products. The software products implement the above methods and procedures. The computer software products may be stored in a storage medium, such as a read only memory (ROM)/random access memory (RAM), magnetic disk, or compact disc-read only memory (CD-ROM), including instructions which, when executed, enable a computer device (a PC, server, or network device) to perform parts of the steps according to the embodiments of the present invention.

In conclusion, the above are merely exemplary embodiments of the present invention. The protection scope of the present invention is not limited thereto. Variations or replacements readily apparent to a person skilled in the prior art within the technical scope of the present invention should fall within the protection scope of the present invention. Therefore, the protection scope of the present invention is subjected to the appended claims.

What is claimed is:

1. A method for data segmentation in data deduplication, the method comprising:
acquiring, by a network device, a segmentation rule corresponding to a length of a current unsegmented data stream, wherein the segmentation rule is used to determine whether portions of the unsegmented data stream should be segmented, and wherein the segmentation rule is based on the length of the current unsegmented data stream in a data stream to be compressed such that as a length of an unsegmented data stream increases, a probability that the corresponding segmentation rule is satisfied increases monotonically, and when the segmentation rule corresponding to a first length is satisfied, the segmentation rule corresponding to a second length is definitely satisfied too, wherein the first length and the second length are the length of the unsegmented data stream, and the first length is smaller than the second length; and segmenting, by the network device, the data stream to be compressed using the segmentation rule, wherein the segmentation rule is used during storage-based data de-duplication, and wherein the segmentation rule is expressed by the following equation:

$$RF(SK)MOD2^{[(\frac{M}{k})]} = cMOD2^{[(\frac{M}{k})]},$$

where SK is data content in the current sliding window, RF(SK) is a content fingerprint of the data content in the current sliding window, c is a preset constant, M is a preset maximum segmentation length, k is the length of the unsegmented data stream, MOD indicates a modulo operation, and M/k indicates a floor function.

2. The method according to claim 1, wherein the segmenting comprises:

calculating a content fingerprint of data content in a current sliding window in the current unsegmented data stream;

determining whether the content fingerprint satisfies the corresponding segmentation rule; and when the content fingerprint satisfies the corresponding segmentation rule, taking a first endpoint of the current sliding window as a segmentation point, wherein the first endpoint is an endpoint of the current sliding window in a same direction as a sliding direction of the current sliding window.

3. The method according to claim 1, wherein acquiring the segmentation rule comprises:

acquiring a preset mapping relationship between lengths of an unsegmented data stream and segmentation rules; and acquiring the segmentation rule corresponding to the length of the current unsegmented data stream by searching in the mapping relationship.

4. The method according to claim 2, wherein acquiring the segmentation rule comprises:

acquiring a preset mapping relationship between lengths of an unsegmented data stream and segmentation rules; and acquiring the segmentation rule corresponding to the length of the current unsegmented data stream by searching in the mapping relationship.

5. The method according to claim 1, wherein the segmentation rule comprises least significant N bits of a content fingerprint of data content in a current sliding window in the current unsegmented data stream, are the same, wherein N decreases monotonically as the length of the current unsegmented data stream increases.

6. The method according to claim 2, wherein the segmentation rule comprises least significant N bits of the content fingerprint being all the same, wherein N decreases monotonically as the length of the current unsegmented data stream increases.

7. The method according to claim 3, wherein the segmentation rule comprises least significant N bits of a content fingerprint of data content in a current sliding window in the current unsegmented data stream, are the same, wherein N decreases monotonically as the length of the current unsegmented data stream increases.

8. A device for data segmentation in data deduplication, the device comprising a processor and a memory coupled to the processor, wherein the processor comprises:

an acquiring module, configured to acquire a segmentation rule corresponding to a length of a current unsegmented data stream, wherein the segmentation rule is used to determine whether portions of the unsegmented data stream should be segmented, and wherein the segmentation rule is based on the length of the current unsegmented data stream in a data stream to be compressed such that as a length of an unsegmented data stream increases, a probability that the corresponding segmentation rule is satisfied increases monotonically, and when the segmentation rule corresponding to a first length is satisfied, the segmentation rule corresponding to a second length is definitely satisfied too, wherein the first length and the second length are the length of the unsegmented data stream, and the first length is smaller than the second length; and a segmenting module, configured to segment the data stream to be compressed using the segmentation rule, wherein the segmentation rule is used during storage-based data de-duplication, and wherein the segmentation rule is expressed by the following equation:

$$RF(SK)MOD2^{[(\frac{M}{k})]} = cMOD2^{[(\frac{M}{k})]},$$

where SK is data content in the current sliding window, RF(SK) is a content fingerprint of the data content in the current sliding window, c is a preset constant, M is a preset maximum segmentation length, k is the length of the unsegmented data stream, MOD indicates a modulo operation, and M/k indicates a floor function.

9. The device according to claim 8, wherein the segmenting module comprises:

a first unit, configured to calculate a content fingerprint of data content in a current sliding window in the current unsegmented data stream;

a second unit, configured to determine whether the content fingerprint satisfies the corresponding segmentation rule; and a third unit, configured to take a first endpoint of the current sliding window as a segmentation point when the content fingerprint satisfies the corresponding segmentation rule, wherein the first endpoint is an endpoint of the current sliding window in a same direction as a sliding direction of the current sliding window.

10. The device according to claim 8, wherein the acquiring module comprises:

a fourth unit, configured to acquire a preset mapping relationship between lengths of an unsegmented data stream and segmentation rules; and a fifth unit, configured to acquire the segmentation rule corresponding to the length of the current unsegmented data stream by searching in the mapping relationship.

11. The device according to claim 9, wherein the acquiring module further comprises:
   a fourth unit, configured to acquire a preset mapping relationship between lengths of an unsegmented data stream and segmentation rules; and
   a fifth unit, configured to acquire the segmentation rule corresponding to the length of the current unsegmented data stream by searching in the mapping relationship.

12. The device according to claim 8, wherein the segmenting module is configured to determine whether least significant N bits of RF (SK) are all 1s when the corresponding segmentation rule is whether least significant N bits of a content fingerprint is 1 or to determine whether least significant N bits of RF (SK) is all 0s when the corresponding segmentation rule is whether least significant N bits of the content fingerprint is 0; and
   wherein SK is data content in the current sliding window, RF (SK) is a content fingerprint of data content in the current sliding window, and N decreases monotonically as the length of the current unsegmented data stream increases.

13. The device according to claim 9, wherein the second unit is configured to determine whether least significant N bits of RF (SK) are all 1s when the corresponding segmentation rule is whether least significant N bits of the content fingerprint is 1 or to determine whether least significant N bits of RF (SK) are all 0s when the corresponding segmentation rule is whether least significant N bits of the content fingerprint is 0; and
   wherein SK is data content in the current sliding window, RF (SK) is a content fingerprint of the data content in the current sliding window, and N decreases monotonically as the length of the current unsegmented data stream increases.

14. The device according to claim 10, wherein the segmenting module is configured to determine whether least significant N bits of RF (SK) are all 1s when the corresponding segmentation rule is whether least significant N bits of a content fingerprint is 1 or to determine whether least significant N bits of RF (SK) are all 0s when the corresponding segmentation rule is whether least significant N bits of the content fingerprint is 0; and
   wherein SK is data content in the current sliding window, RF (SK) is a content fingerprint of data content in the current sliding window, and N decreases monotonically as the length of the current unsegmented data stream increases.

* * * * *